United States Patent [19]
DePauli

[11] Patent Number: 4,851,681
[45] Date of Patent: Jul. 25, 1989

[54] INFRARED SENSOR SIGNAL CONDITIONER

[75] Inventor: John F. DePauli, San Diego, Calif.

[73] Assignee: Westek Associates, San Diego, Calif.

[21] Appl. No.: 165,516

[22] Filed: Mar. 8, 1988

[51] Int. Cl.$^4$ .............................................. H03F 1/00
[52] U.S. Cl. .................................. 250/338.1; 330/294
[58] Field of Search ................... 250/338.1; 330/294, 330/107, 99, 260, 253

[56] References Cited

U.S. PATENT DOCUMENTS 4,705,946 11/1987 Cargille .......................... 250/338.1

FOREIGN PATENT DOCUMENTS 102532 6/1985 Japan ............................... 250/338.1

*Primary Examiner*—Janice A. Howell
*Assistant Examiner*—Constantine Hannaher
*Attorney, Agent, or Firm*—Brown, Martin, Haller & McClain

[57] ABSTRACT

A high gain bandpass amplifier for amplifying low frequency, low level signals ouptut from ceramic infrared sensors. The amplifier includes an input capacitor having a pair of terminals with one of the terminals for receiving the infrared sensor output signal. A first MOS operational amplifier having inverting and noninverting inputs and an output, has its inverting input connected to the other terminal of the input capacitor. A first feedback network is coupled between the first amplifier inverting input and output. A resistor having a pair of terminals has one terminal connected to the first amplifier output. A second MOS operational amplifier also having inverting and noninverting inputs and an output has its inverting input connected to the other terminal of the resistor. The noninverting inputs of the first and second amplifiers are connected together and receive the reference voltage. A second feedback network is coupled between the second amplifier inverting input and output. An output capacitor having a pair of terminals has one terminal connected to the output of the second amplifier. The amplified sensor output signal is coupled out of the amplifier at the other terminal of the output capacitor.

14 Claims, 3 Drawing Sheets

INFRARED SENSOR SIGNAL CONDITIONER

BACKGROUND OF THE INVENTION

I. Field of the Invention

The present invention relates to infrared sensor signal processors. More specifically, the present invention relates to a novel and improved high gain bandpass amplifier for conditioning signals received from a passive infrared sensor.

II. Background Art

The advances in the development of solid state infrared sensors, namely crystal sensors, have reached a point where their cost has fallen sufficiently for consideration for applications in moderate cost consumer products. Accordingly, interest has grown in the development of electronic circuitry to most economically utilize these sensors in minimal cost consumer products. At the present time, the most sensitive of these sensors is lithium titinate crystals. Such crystal sensors provide a maximum usable output signal on the order of a few hundreds of microvolts in response to a human body moving within a few meters of the sensor. Although these particular sensors are extremely sensitive to infrared radiation including human body heat, they are relatively expensive. Furthermore, these sensors are extremely sensitive to heat and, therefore, are not adapted to withstand conventional industrial wavesoldering techniques used in the high-volume fabrication of consumer devices.

In the entire class of infrared sensors, there exists one particular sensor type which falls within the manufacturing and cost requirements of consumer goods. This sensor type is the ceramic sensor. Ceramic sensors are not only less expensive than crystal sensors, but are also sufficiently insensitive to temperature extremes. This insensitivity to heat readily permits their usage in circuit designs which use economical wavesoldering techniques. As such, the use of ceramic infrared sensors realize a cost-of-use within a cost range adaptable to low cost consumer products.

Although the cost and temperature ruggedness factors of the ceramic sensors are advantageous over other types of sensors, certain disadvantages exist. The primary disadvantage of using ceramic sensors is their low signal level output. Ceramic sensors typically provide a maximum signal on the order of a few tens of microvolts in response to a human body moving within a range of a few meters from the sensor. In addition, the peak signal level may last from a second to a few hundred thousandths of a second.

In the typical low cost consumer product, unshielded plastic housings must be used to realize cost savings. The use of unshielded plastic housings means that the electronic design must be inherently capable of reliably responding to the microvolt level shifts of the ceramic sensor. Furthermore, the electronic design must simultaneously ignore a full range of ambient electrical noise signal which are typically several orders of magnitude larger than the sensor signal.

In fabricating a low cost consumer product, it is important that the electronic circuitry be designed such that there exist a low part count and low cost associated with the design to be competitive in the consumer market. It is well recognized that part cost, part count and part size along with assembly costs are exceedingly critical in consumer product designs. Part and assembly costs are both affected by the electrical and physical size of the components, with electrically larger parts typically costing more and occupying more space throughout the manufacturing process as well as within the product itself. It is, therefore, economically desirable that any consumer product be implemented with the smallest size as well as the fewest number of values of components as is possible. The market success of a low cost consumer product incorporating leading edge technology, such as ceramic infrared sensors, requires minimal electronic systems to support the technology.

It is also well known that electronic components may be obtained in practical)y any desired value. However, when standard value parts are used, costs may be minimized and the availability of the part for production is maximized. It is also a consideration in the fabrication of consumer products to utilize the most cost and performance effective technology available for implementing high volume production.

In using ceramic sensors, the output signal from the sensor must be filtered and amplified for later processing. Conventionally, a low pass filter designed for operation in a frequency range around 1 Hz, require capacitors in the 2-50 microfarad range. Accordingly, capacitors in this range are typically large and expensive. In addition, to achieve more than a 6 Db per octave slope, second or higher order filters are needed which use several of the large value capacitors.

In amplifying low level signal, the typical amplifiers used are operational amplifiers. However, conventional operational amplifiers vary in the level of input offset voltages and currents. Amplifiers having extremely low levels of offset voltages and currents are typically found only in expensive selected units. Amplifiers available at costs compatible with low cost consumer products tend to exhibit input offset voltages and currents larger than signal levels that are output by a ceramic sensor. Furthermore, amplifiers used in low cost consumer products tend to exhibit equally large lot-to-lot variations. Conventional amplifier designs used in extremely low frequency, low level signal applications previously incorporated offset adjustments. These adjustments may be either made by incorporating either manual external offset adjustment potentiometers or auto-zeroing circuitry to compensate for the large output offset which result when high gain circuitry is used. In either case the additional circuitry required or manufacturing time to adjust the product can add additional cost to the product.

Low cost consumer products utilizing ceramic sensors and their related electronics may involve the use of power control circuitry. For example, in one application of the present invention, the sensor and associated electronics is used to control a thyristor/triac which controls the illumination of an incandescent lamp. Lamp loads may reach up to 300 watts with power provided directly off a 120 volt, 60 Hz line. The use of power control circuitry typically creates large spike-like transients with each turn-on of the controlled device. In many consumer products, it is necessary for the sensor and the sensor signal conditioning electronics to be mounted on a circuit board within a housing within a few centimeters of the switching triac and the AC power line. In such situations, the close proximity of the power and power control electronics to be sensor electronics can result in noise problems, should the sensor electronics be not sufficiently insensitive to the noise.

SUMMARY OF THE INVENTION

The present invention is a novel and improved high gain bandpass amplifier for use in conditioning low frequency, low voltage signals output from ceramic infrared sensors.

The present invention comprises a high gain bandpass amplifier for receiving a reference voltage and for amplifying an output signal received from an infrared sensor. The amplifier includes an input capacitor having a pair of terminals with one of the terminals for receiving the infrared sensor output signal. A first MOS operational amplifier having inverting and noninverting inputs and an output, has its inverting input connected to the other terminal of the input capacitor. A first feedback network is coupled between the first amplifier inverting input and output. A resistor having a pair of terminals has one terminal connected to the first amplifier output. A second MOS operational amplifier also having inverting and noninverting inputs and an output has its inverting input connected to the other terminal of the resistor. The noninverting inputs of the first and second amplifiers are connected together and receive the reference voltage. A second feedback network is coupled between the second amplifier inverting input and output. An output capacitor having a pair of terminals has one terminal connected to the output of the second amplifier. The amplified sensor output signal is coupled out of the amplifier at the other terminal of the output capacitor.

It is an object of the present invention to provide a novel and improved high gain bandpass filter/amplifier for filtering and amplifying low frequency, low voltage signals.

It is another object of the present invention to provide a signal conditioning circuit for low voltage input signals which provides improved filtering capabilities of low frequency signals with minimal capacitor sizes.

It is a further object of the present invention to provide a high gain bandpass amplifier capable of conditioning a low voltage signal and is highly insensitive to external noise.

It is a further object of the present invention to provide an amplifier design for low frequency, low level signal applications using novel techniques for eliminating offset voltage and current compensatory circuitry.

It is still a further object of the present invention to provide a high gain bandpass amplifier using standard value electronic components.

It is another object of the present invention to provide a high gain bandpass amplifier for use with ceramic infrared sensors while achieving minimal part size, count and cost along with minimal assembly costs for fabricating low cost consumer products.

It is yet a further object of the present invention to capable of implementation in high volume production using standard cell CMOS technology.

BRIEF DESCRIPTION OF THE DRAWINGS

These and other features, advantages and objects of the present invention will become more fully apparent when taken in conjunction with the following drawings in which like reference characters correspond throughout and wherein.

DETAILED DESCRIPTION OF THE PREFERRED EMBODIMENTS

Figure 1:
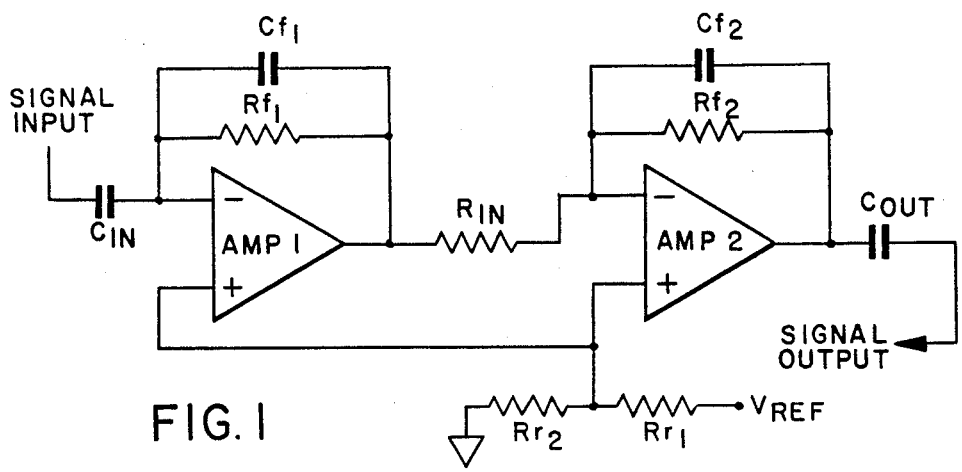
FIG. 1 is a schematic diagram of the high gain bandpass amplifier of the present invention.

Turning now to the drawings, FIG. 1 illustrates a preferred embodiment of the high gain bandpass amplifier of the present invention. In FIG. 1, a signal output from a ceramic infrared sensor (not shown) is coupled as a signal input to one terminal or plate of capacitor $C_{IN}$. The other plate or terminal of capacitor $C_{IN}$ is coupled to the inverting input of a CMOS operational amplifier AMP 1. Coupled in between the inverting input and output of amplifier AMP 1 is a feedback network comprised of parallel connected resistor $Rf_1$ and capacitor $Cf_1$.

The output of amplifier AMP 1 is also coupled through resistor $R_{IN}$ to the inverting input of a second CMOS operational amplifier AMP 2. The noninverting inputs of amplifiers AMP 1 and AMP 2 are coupled to a voltage divider at a point between series coupled resistors $Rr_1$ and $Rr_2$. Resistors $Rr_1$ and $Rr_2$ are coupled between a reference voltage $V_{REF}$ and ground.

Coupled across the inverting input and output of amplifier AMP 2 is a feedback network comprised of parallel connected resistor $Rf_2$ and capacitor $Cf_2$. Also coupled to the output of amplifier AMP 2 is one terminal or plate of capacitor $C_{OUT}$. The other terminal or plate of capacitor $C_{OUT}$ is the amplifier circuit output. Amplifiers AMP 1 and AMP 2 are powered from a single predetermined voltage power source (not shown).

The circuit of FIG. 1 is fabricated in standard cell CMOS technology with amplifiers AMP 1 and AMP 2 along with resistors $R_{IN}$, $Rf_2$, $Rr_1$ and $Rr_2$ formed within the same semiconductor chip. Therefore, a minimal external part, high gain bandpass amplifier is realized with the required external components being capacitors $C_{IN}$, $Cf_1$, $Cf_2$ and $C_{OUT}$ along with resistor $Rf_1$. Fabrication of analog circuits, such as the circuit of FIG. 1, along with specific digital circuitry in a CMOS semiconductor chip is well known. One such source for the fabrication of hybrid integrated chips is Motorola Inc..

The circuit of FIG. 1 meets the inherent technical demands in interfacing with a low sensitivity body heat sensor, i.e. ceramic infrared sensor, by providing an economical high gain bandpass amplifier. The circuit of FIG. 1 accomplishes all functions of signal amplification, AC and RFI noise rejection, and offset adjustmentless operation when constructed using standard cell CMOS fabrication techniques. In addition, a minimum of standard value, minimal size and minimal cost external components are required to implement the circuit of FIG. 1.

A typical application of the circuit of FIG. 1 is in a low cost consumer product which uses a ceramic infrared typically a lead zirconium titinate sensor. The value of capacitor $C_{IN}$ is typically 1.0 microfarads, capacitor for $Cf_1$ is 0.02 microfarads and resistor $Rf_1$ is 10 megohms. Resistor $R_{IN}$ is typically 5500 ohm. Resistor $Rf_2$ and capacitor $Cf_2$ are respectively 500 kilohms and 0.68 microfarads, while capacitor $C_{OUT}$ is 0.1 microfarads. The circuit is typically designed to use a reference voltage in the range of +1.75 to 1.80 volts at the noninverting input of amplifiers AMP 1 and AMP 2 with the reference voltage $V_{REF}$ being 3.75 volts. In the design fabricated in an integrated chip, the voltage range of the voltage VREF varies from chip-to-chip within the range of 3.55–3.60 volts while the voltage appearing at the noninverting input of amplifiers AMP 1 and AMP 2 is correspondingly in the range of 1.54–1.55 volts.

Commercial operational amplifiers typically exhibit offset voltages which are in the range of 1–10 millivolts. These offset voltages are ordinarily amplified by the gain of the amplification stage. As such, offset voltages severely limit the amount of gain a stage can have unless the offset voltage is adjusted for or compensated out. Single supply operational amplifiers require that their inputs and outputs be biased to DC level above ground and are AC coupled in order to permit symmetrical amplification of signals both above and below ground polarities, i.e. AC signals.

In the present invention, it is desirable that the first stage operational amplifier have maximum signal gain, ideally approaching the DC open loop gain and in the range of 10,000–40,000 (80 Db-92 Db). At such DC gain levels, a DC offset of as little as 80-250 microvolts can drive the output of the amplifier to saturation. Furthermore, with such a high DC gain, the biased voltage to bring the output above ground for AC amplification would also be on the same order of 80-250 microvolts, depending upon the actual gain of the particular amplifier. In the present invention, the circuit of FIG. 1 utilizes the advantages that the signal of interest for amplification is in the extremely low frequency range and is not a DC voltage.

In the circuit of FIG. 1, as the capacitive reactance of capacitor $Cf_1$ approaches and exceeds the resistance of resistor $Rf_1$, the impedance of the feedback loop crosses over from capacitive to resistive. As such, the differentiator-feedback crosses over to integrator-feedback. At the corner frequency of 0.795 hertz for the capacitor and resistor values previously mentioned, the reactance of capacitor $Cf_1$ equals the resistance of resistor $Rf_1$. At this frequency, neither differentiator-feedback nor integrator-feedback predominates. At this corner frequency, an equivalent AC gain on the order of 50 (34 Db) is realized.

In the operation of the circuit of FIG. 1, operational amplifier AMP 1 incorporates an integration function. Amplifiers AMP 1, and AMP 2, are both typically fabricated adjacent one another on a semiconductor substrate in a standard cell CMOS semiconductor chip. Amplifiers AMP 1 and AMP 2 fabricated using these techniques have no shunting between each input to ground, as is found in conventional operational amplifiers. The inverting input of amplifiers AMP 1 and AMP 2 as are configured in FIG. 1 are essentially each at a floating potential. Since there is no DC path for current flow from the output side of capacitors $C_{IN}$, i.e. the terminal of capacitor $C_{IN}$ connected to the input of amplifier AMP 1, to ground except through resistor $Rf_1$ and the output driving transistors of amplifier AMP 1, capacitor $C_{IN}$ sees the inverting input summing point of amplifier AMP 1 as an extremely high impedance. Concomitantly, the summing point sees capacitor $Cf_1$, at low frequencies, as simply a high impedance source of voltage and current. The "reactive" nature of the resistance of $C_{IN}$ is transparent to the summing point, and is seen as simply a "series resistance." This "series resistance" value transparently varies depending upon the rate of change of the frequency of the input voltage.

Figure 3:
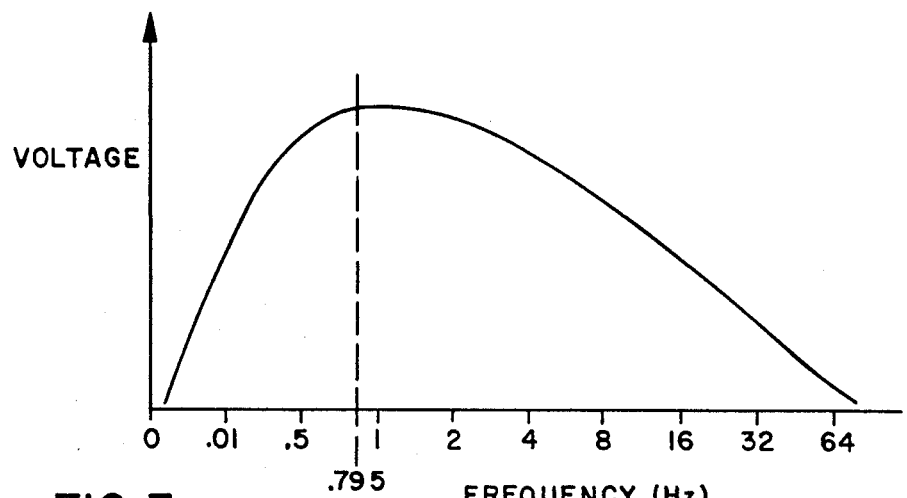
FIG. 3 is a graph illustrating the frequency response characteristics of the amplifier of FIG. 1.

The gain of an electronic integrator is inversely proportional to the product of the series resistance in the input, and the capacitance in the feedback loop. The value of the impedance of capacitor $C_{IN}$ effectively rises with the increasing frequency such that amplifier AMP 1 exhibits a variable amount of integrator gain. This gain is on the order of 1,000 (60 Db) at 1.59 Hz through 855 (58.6 Db) at 1.35 Hz, 314 (50 Db) at 0.5 Hz, 78 (38 Db) at 01.25 Hz and 10 (20 Db) at 0.15 Hz. FIG. 3 illustrates in graphical form the gain function as it relates to the circuit output voltage versus frequency from DC to 64 Hz.

Figure 4:
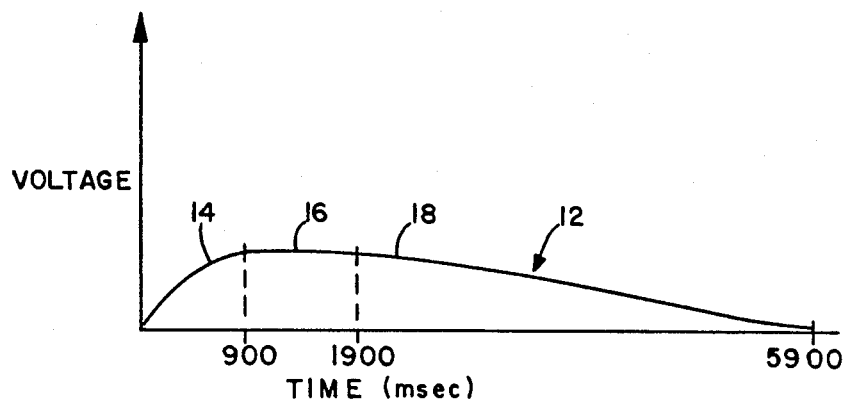
FIG. 4 is a graph illustrating the output signal characteristics of a typical ceramic infrared sensor in response to a step input.

The absolute gain at the previously-mentioned frequencies is lessened somewhat by the presence of the resistance of resistor $Rf_1$. Resistor $Rf_1$ functions, in the integration mode, as a 200 millisecond time constant bleeder. With resistor $Rf_1$ installed in parallel with capacitor $Cf_1$, the gain response of amplifier AMP 1 is somewhat flattened. However, a shaped gain curve giving substantial integrator gain operative over the same range of frequencies as the signal sensor is realized. In essence, the shape of the damped integrator gain curve closely approximates the shape of the sensor fundamental output signal waveform which is illustrated in FIG. 4.

The output voltage of an integrator is proportional to the gain of the integrator times the amplitude of the input voltage times the length of time the input voltage is at that amplitude. Accordingly, the output voltage of amplifier AMP 1 in response to an input signal in the form illustrated in FIG. 4, ramps up at a high gain during a first epoch, of the sensor signal. This first epoch defined as the time period 0–900 milliseconds of FIG. 4 which illustrates a typical response of the sensor to a step input of infrared radiation. The output voltage of amplifier AMP 1 continues rising at a slightly lower gain during the first part of the second epoch of the sensor signal curve, the second epoch occurring during the time period 900–1900 milliseconds of FIG. 4. During the second part of the second epoch, the output voltage begins ramping down under the combined influence of the integrator gain and the 200 millisecond bleeder resistor $Rf_1$.

The output signal from the sensor is DC decoupled from the inverting input of amplifier AMP 1 by a low leakage capacitor $C_{IN}$ which is typically a 1.0 microfarad capacitor. The gain of amplifier AMP 1 is determined by the ratio of the impedance of the feedback loop to the impedance of the input circuit. For a DC level, both capacitors $C_{IN}$ and $Cf_1$ appear as extremely high impedances, typically in excess of 10–100 megohms with low leakage components. Therefore, the impedance of capacitors $C_{IN}$ and $Cf_1$ are in excess of the 10 megohm resistance of resistor $Rf_1$. Since there is no other DC path to ground, the DC gain of amplifier AMP 1 is, therefore, unity. Although capacitor $Cf_1$ is not actually a part of the DC gain or bias circuitry, the presence of capacitor $Cf_1$ does not affect the operation of the biasing and DC gain elements. Upon application of a positive bias voltage on the order of 1–3 volts at the noninverting input of amplifier AMP 1, the output voltage of amplifier AMP 1 rises to precisely this voltage plus or minus the exact offset voltage of amplifier AMP 1.

When viewed from a traditional AC standpoint, amplifier AMP 1 and its associated circuitry, i.e. capacitors $C_{IN}$ and $Cf_1$, and resistor $Rf_1$, the circuit has a gain of 50 (34 Db) as an amplifier for AC signals. This gain of 50 is a result of the ratio of the impedances of $Cf_1$ to $C_{IN}$. At a to capacitor $C_{IN}$ is respectively 135,630 ohms to 2653 ohms. In reality, the circuit operates as a unity gain amplifier for 60 Hz AC signals and high frequency transients.

While bipolar based operational amplifiers are said to be "high impedence" input devices, the inverting input is actually a virtual ground for input voltages and a continuous input current is required to maintain a given output voltage level. However, implementing operational amplifiers in CMOS technology allows the use of a MOSFET input stage for the operational amplifier. A MOSFET input stage is a truly high impedance input requiring only the injection or extraction of sufficient charge to change the field voltage on the insulating gate which controls the internal current flow. The capacitance of this gate is typically less than 1.0 picofarad and is shunted by parasitic capacitances associated with the package lead frame and electronic protection devices. The input stage then typically has an apparent input capacitance on the order of 5 picofarads.

Since the amount of charge associated with the particular voltage on a capacitor is equal to the voltage times the capacitance, a 5 picofarad capacitor requires only on the order of a 5 attocoulombs charge change to reflect a 1 microvolt change. This amount of charge corresponds to 31 electrons, and is indicative of the sensitivity possible With small geometry CMOS amplifiers. In a CMOS design, the operational amplifier has a truly high impedance input such that the feedback circuitry is not "loaded" by the operational amplifier. In the absence of any other current loading circuitry connected to the input summing point, the operational amplifier acts as a unity gain inverter regardless of the resistance, or impedence, of the feedback loop.

Referring now to FIGS. 1 and 3–5, an understanding of the operation amplifier AMP 1 which provides unity gain for DC, transient and 60 Hz AC signals and significant gain to low frequency signals is presented. For this example, the output signal of a typical infrared sensor is in response to a step input. The step input may be provided by a human first stepping into the sensor field of view in which the sensor correspondingly responds by providing the output signal.

FIG. 3 illustrates the gain of the amplifier circuit of FIG. 1. The gain is very low at DC while rising to a peak at 0.795 Hz. The gain decreases as it approaches 60 Hz which is typically the frequency of residential 120 V AC power. From FIG. 3, noise from power control circuitry and other circuitry at AC line frequency, along with high frequency transients, are amplified at significantly lower gain factors than signals about the 0.795 Hz frequency that are typically provided by a ceramic sensor when sensing human or animal body heat. As such, the gain variation as a function of frequency of the circuit enables DC and higher frequencies, such as AC power line frequencies, to be greatly attenuated in comparison to the signals of interest.

FIG. 4 illustrates a typical signal output of a ceramic infrared sensor in response to a step input of radiation at a 9.4 micron wavelength. For purposes of illustration, the response curve, curve 12, may be divided into three time zones or epochs. The portion of curve 12 indicated by the reference numeral 14 occurs during the first epoch and lasts approximately 900 milliseconds. During the first epoch, the sensor output rises at a quasilog approximately 370 milliseconds. During the first epoch, the waveform is equivalent to one-half of what would be realized if a square wave signal of a frequency of 1.35 Hz was shunted by a capacitive network having a time constant of 300 milliseconds. It should be noted that curve portion 14 during the first epoch has the fastest rise time of any portion of signal curve 12.

The second epoch of curve 12, indicated by curve portion 16, lasts approximately 1,000 milliseconds. During epoch 2, the output signal is within approximately 10% of its maximum, while rising slowly and then falling over the epoch. During the second epoch, the waveform is equivalent to one-half of a low amplitude sine wave signal of a frequency 0.5 Hz, offset from ground.

During the third epoch of curve 12, indicated by curve portion 18, the output signal exhibits a virtually linear decay. The decay rate is approximately 0.025% per millisecond. The waveform occurring during the third epoch is equivalent to the falling one-half of a triangular wave signal of a frequency 0.125 Hz.

It should be noted that the frequency of the response signal presented to the amplifier circuit of FIG. 1 is extremely low. Therefore, the circuit of FIG. 1 is able to obtain significant signal amplification by viewing the feedback circuit of amplifier AMP 1 as a current source/sink path for the charging/discharging of capacitor $C_{IN}$. The maximum voltage output of the sensor depends upon the intensity of infrared radiation. Intensity of the infrared radiation is a factor dependent upon body temperature and distance from the sensor. For example, assume a sensor output signal has a maximum voltage of 10 microvolts. i.e. the input impedance of amplifier AMP 1 and its feedback network, the signal voltage will appear at the inverting input of amplifier AMP 1 initially as a field effect. Since the inverting input of amplifier AMP 1 requires only 5 attocoulombs of charge to change the output voltage level by 1 microvolt, the charge on capacitor $C_{IN}$ does not need to appreciably change to affect a 1 microvolt change at the output of amplifier AMP 1. As the output signal voltage from the sensor begins rising, the output voltage of amplifier AMP 1 begins slewing at an open loop gain of 10,000 (80 Db), i.e. 10 millivolt per microvolt. The feedback voltage appears at the junction of capacitor $C_{IN}$, the inverting input of amplifier AMP 1, and the feedback loop. The input side of capacitor $C_{IN}$, i.e. the terminal coupled to the sensor, is referenced to ground through a nominal 120 kilohm resistor. This 120 kilohm resistor is a source resistor for a FET follower Contained in the sensor itself. Therefore, a charge/discharge path exists from the output of amplifier AMP 1. This discharge path has a minimum impedance of 120 kiliohms and a maximum impedance of 10 megaohms, to the amplifier AMP 1 output source/sink. As the sensor signal output voltage rises, a charge deficit/excess develops across capacitor $C_{IN}$ which amounts to (Q=Vf) or $1^{e-12}$ Q/microvolt. At signal-of-interest frequencies, the current impedance of the feedback path is relatively high. Therefore, the feedback path provides a source/sink capability on the order of 0.1–0.3 picocoulombs per millivolt output per 1,000 microseconds. With reference to FIG. 4, there is a several hundred millisecond lag before the compensating feedback current can balance the charge discrepancy across capacitor $C_{IN}$. During this lag time, the output voltage of amplifier AMP 1 is on the order of 10 millivolts per microvolt of a signal-feedback difference. The output of amplifier AMP 1 is on the order of 10 millivolts per microvolt of signal-feedback difference. The effective output signal of amplifier AMP 1 is as if the first stage were a "reverse slope differentiator," thus giving a pulsed output for low frequency signals. The resultant signal gain from amplifier AMP 1 is in the order of 70–80 Db.

Amplifier AMP 2 and its associated circuitry, input resistor $R_{IN}$ and feedback network capacitor $Cf_2$ and resistor $Rf_2$, operates as a conventional unity gain amplifier. The inverting input of amplifier AMP 2 is driven resistively from the output of amplifier AMP 1. At a frequency of 60 Hz, the 390 ohm impedance of the feedback capacitor $Cf_2$ is less than the resistance of the 5500 ohm coupling resistance of resistor $R_{IN}$. Therefore, amplifier AMP 2 acts as an active attenuator at this frequency. At the signal of interest frequencies, frequencies in the range of approximately 0.4–0.9 Hz, the feedback impedence, capacitor $Cf_2$ and resistor $Rf_2$, and the input resistor $R_{IN}$ form a dynamic voltage divider which requires an output voltage to input voltage ratio of 21.5 at 1.59 Hz through 76 at 0.1 Hz to 101 at DC.

Figure 5:
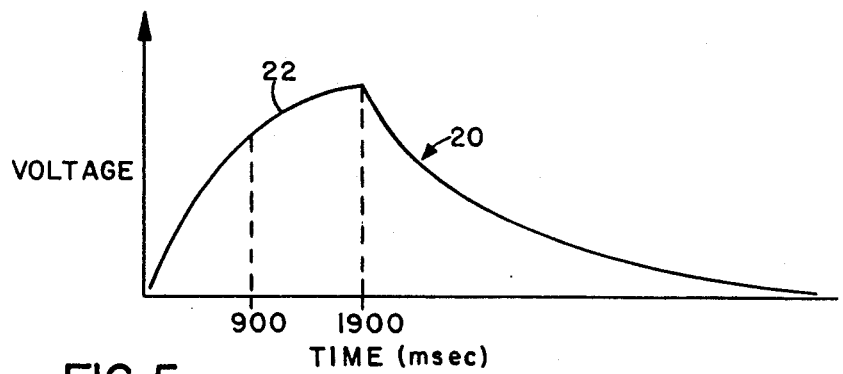
FIG. 5 is a graph illustrating the signal output of the amplifier of FIG. 1 in response to a ceramic infrared sensor signal output.

The signal output of the amplifier AMP 2 of FIG. 1 is illustrated in FIG. 5 as curve 20. During the first epoch of the sensor signal output, i.e. curve portion 14 of FIG. 4, the gain from amplifier AMP 2 is on the order of 25. The rise to a 10–20 millivolt peak output from amplifier AMP 1, appears at the output of amplifier AMP 2 as a rise to a 250–500 millivolt level. During the first and second epochs of the sensor signal output, the output voltage of amplifier AMP 2 also rises, corresponding to curve portion 22 of FIG. 5. As the output signal from the sensor ramps up towards a peak, amplifier AMP 1 no longer needs supply charging current for capacitor $C_{IN}$; and the output voltage of amplifier AMP 1 thus returns to the presignal level.

Amplifier AMP 2 sees the change in output voltage of amplifier AMP 1 and initially amplifies the signal at a high gain. The amplification of the signal by amplifier AMP 2 is augmented by the voltage across capacitor $Cf_2$ and further "differentiates" the signal occurring during the third epoch. The signal "differentiation" is illustrated in curve portion 24.

The circuit of FIG. 1 provides a signal gain on the order of 100,000 (97 Db), while holding input noise level gain to unity. The circuitry is self-compensating for lot-to-lot variations in standard cell CMOS design with the operational amplifier offsets over the full commercial range being plus or minus 10 millivolts. The circuitry requires only four small standard value capacitors and one standard value resistor external to a standard cell CMOS chip to provide a minimal part, minimal cost circuit for coupling to a ceramic infrared sensor.

Figure 2:
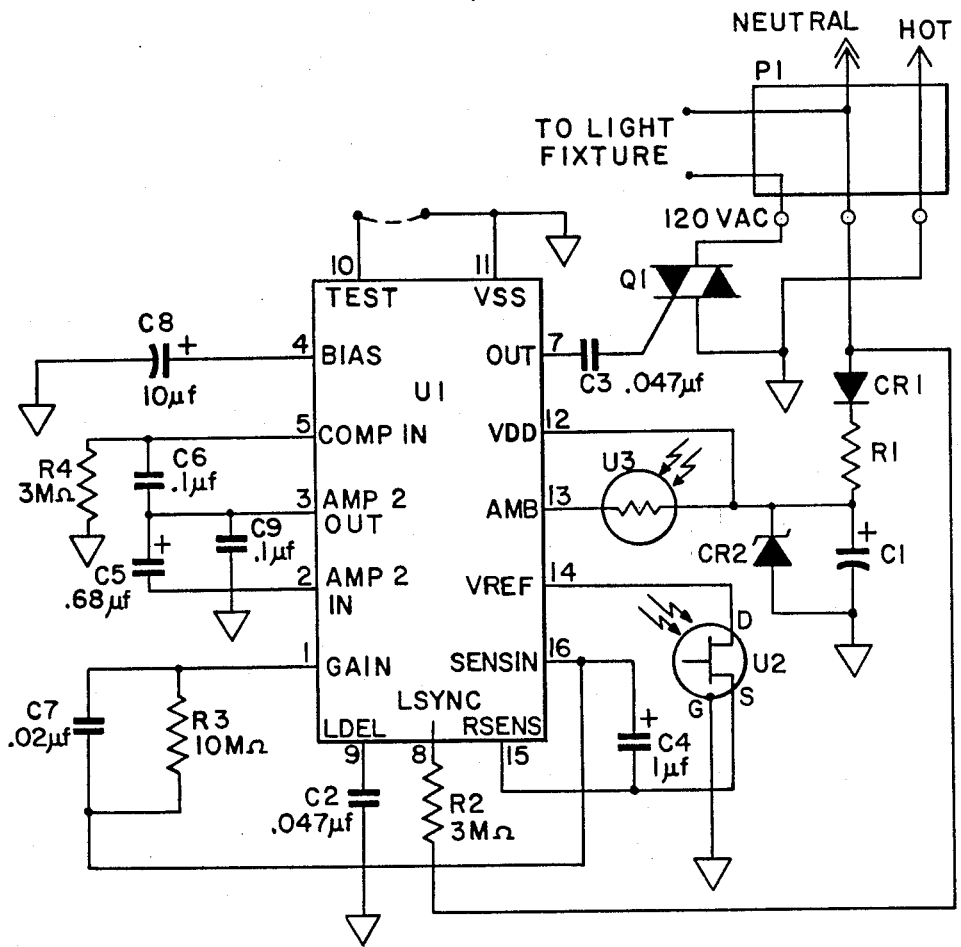
FIG. 2 is an overall circuit implementation of the high gain bandpass amplifier of FIG. 1 in a circuit for controlling an electrical lamp in response to body heat detection and ambient light sensing.

FIGS. 2 and 5 illustrate an exemplary consumer product application of the high gain bandpass amplifier of FIG. 1. In FIGS. 2 and 5, a circuit is disclosed for controlling the illumination of a lamp by detection of the presence, i.e. motion, of a human within the range of a sensor mounted within a self-contained unit.

In FIG. 2, a plug P1 is coupled to a typical residential or commercial wall receptacle, or in the alternative directly hard-Wired to the power circuit, which provides 120 volt, 60 Hz AC power to the circuit. A lamp fixture is then coupled to plug P1 and is provided with power through P1 via a triac Q1 which is controlled by the circuit. Power is provided to an integrated circuit chip U1 through a rectification and regulation circuit comprised of diode CR1, resistor R1, capacitor C1 and zener diode CR2. The rectification and regulation circuit provides power to input pin 12 of semiconductor chip U1.

Ambient light sensor U3, which is typically a cadmium sulfide sensor, is also coupled to the output of the rectification and regulation circuit to receive operating power. Sensor U3 provides a high output signal when ambient lights strikes the sensor. Chip U1 converts the supply voltage into a first reference voltage the VREF which is provided at pin 14 to a ceramic infrared sensor U2. Sensor U2 includes a gate, drain and source. The drain of sensor U2 coupled to pin 14 and the gate of sensor O2 is coupled to ground. The source of sensor U2 is coupled to pin 15 of chip U1 which is coupled to ground through a resistor (not shown) internal to U1. The source of sensor 02 is also coupled through capacitor C4 to pin 16 of U1. Capacitor C4 corresponds to capacitor $C_{IN}$ of the amplifier circuit of FIG. 1. Resistor R3 and capacitor C7 are coupled in parallel across pins 16 and 1 and function as the feedback network to an amplifier (not shown) but corresponding to amplifier AMP 1 in FIG. 1.

The output of the amplifier corresponding to amplifier AMP 1 of FIG. 1 is coupled through an internal resistor (not shown) corresponding to resistor RIN in FIG. 1, to a second amplifier (not shown) and corresponding to amplifier AMP 2 of FIG. 1. This second amplifier includes an internal resistor (not shown) coupled across pins 2 and 3 which corresponds to resistor $Rf_2$ of FIG. 1, while capacitor C5 corresponding to capacitor $Cf_2$ is also coupled across pins 2 and 3. The output of the second amplifier, located at pin 3, is coupled to ground through capacitor C9. An additional capacitor C6 is coupled at pin 3 from which the output signal from the second amplifier is coupled at pin 5 to a comparator circuit (not shown) in U1. Pin 5 is also coupled to ground through resistor R4.

A bias network internal to chip U1 is coupled through capacitor C8 to ground. A test input is provided at U10 while a ground input is provided at U11. The test input circuitry of 01 provides a control signal at pin 7 through capacitor C3 to a gate of triac Q1. Triac Q1 controls the power to a lamp fixture coupled to the unit at plug P1. AC line power is provided to an internal line sync circuit (not shown) at pin 8 through resistor R2 with the line sync circuit coupled to ground ar pin 9 through capacitor 12.

Figure 6:
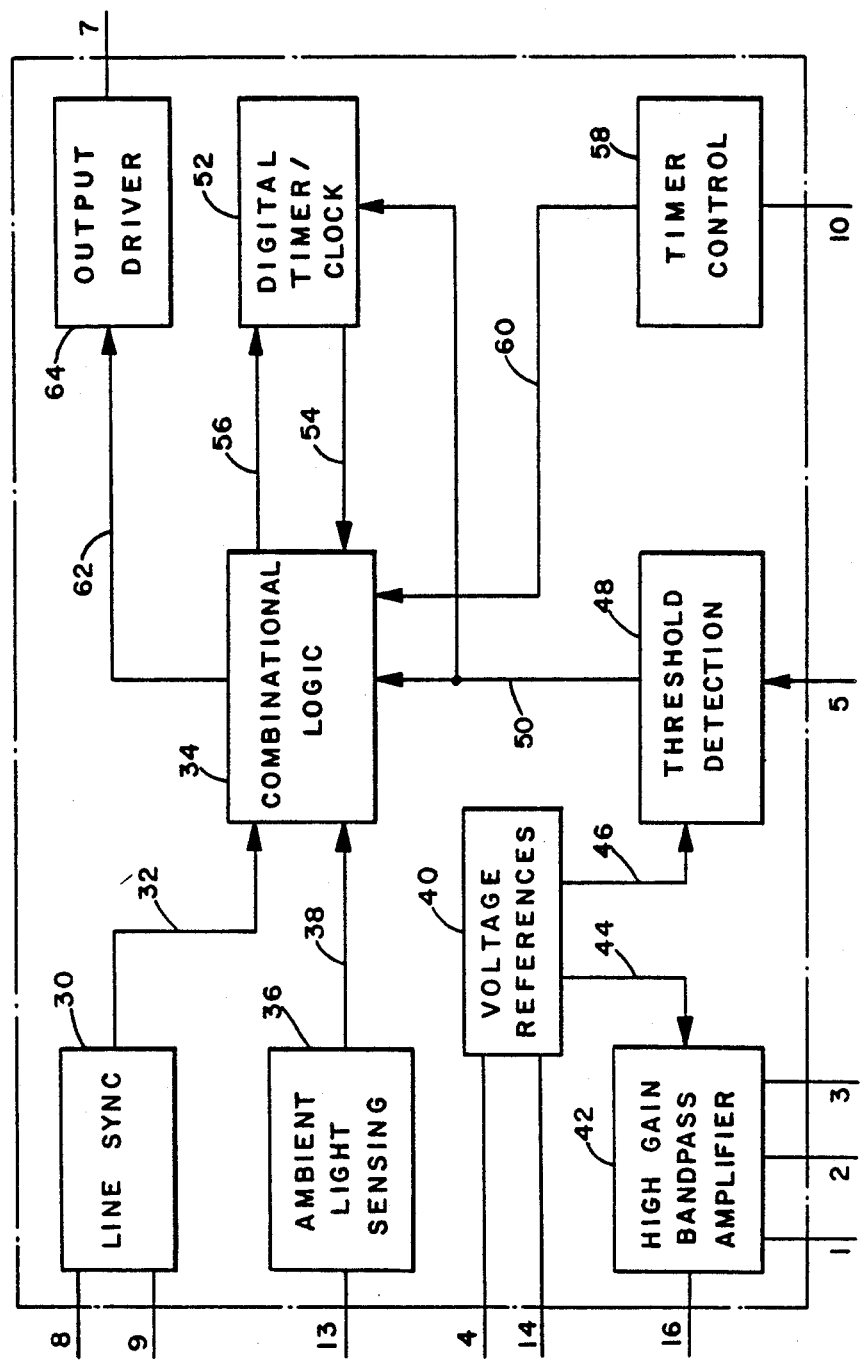
FIG. 6 is a block diagram illustrating the functional components of the integrated circuit of FIG. 2 incorporating the high gain bandpass amplifier of FIG. 1.

FIG. 6 illustrates in block diagram form the functional elements of chip 01. Chip U1 is fabricated using standard cell CMOS technology which may incorporate both digital and analog circuit elements. Chip 01 includes line sync circuitry 30 that is coupled to the input AC power through pins 8 and 9. Line sync circuitry 30, which provides at an output on line 32 to combinational logic 34. Pin 13 is coupled to an input of ambient light sensing circuit 36 which provides an output on line 38 to combinational logic 34. A voltage reference circuit 40 is configured within the chip 01 and provides a pair of reference voltages internally and at pins 4 and 14. Voltage reference circuit 40 provides the reference voltages to the components of high gain bandpass amplifier circuit 42 via line 44. High gain bandpass amplifier circuit 42 is complete when considered along with the external components previously described in reference to FIG. 2 coupled at pins 1, 2, 3 and 16 and illustrated in FIG. 1. Voltage reference circuit 40 is also coupled by line 46 to threshold detection circuit 48. Threshold detection circuit 48 receives the output from the high gain bandpass amplifier circuit 42 via capacitor C6 coupled between pins 3 and 5. Threshold detection circuit 48 provides an output via line 50 to combinational logic 34 and digital timer/clock circuit 52.

Digital timer/clock 52 provides an output on line 54 to combinational logic while receiving an input from combinational logic 34 on line 56. Chip 01 also includes timer control circuit 58 which has an input coupled to pin 10 and provides an output on line 60 to combinational logic 34. Combinational logic 34 provides an output signal on line 61 to an output driver circuit 64 which provides an output at pin 7 to triac Q1 via capacitor C3.

Line sync 30 receives at pins 8 and 9 the AC line signal and detects the zero crossings in the AC voltage waveform. Line sync 30 provides corresponding zero crossing detection output pulses on line 32 to combinational logic 34.

Ambient light sensing circuit 36 provides a high output signal on line 38 when ambient light detected by ambient light sensor U3 exceeds a predetermined threshold level. When the ambient light is below the threshold level, ambient light sensing 36 provides a low signal on line 38 to combinational logic 34.

Infrared sensor U2 is coupled to high gain bandpass amplifier circuit 42. Sensor U2 provides an output signal to amplifier circuit 42 as previously described. In response to the signal output from sensor 02, amplifier circuit 42 provides an output signal, having a signal waveform as illustrated in FIG. 5. The amplifier circuit output signal is coupled via capacitor C6 to threshold detection circuit 40. Threshold detecting circuit 48 is typically implemented as a comparator which compares the voltage output from amplifier circuit 42 with a predetermined threshold voltage, typically 200 millivolts. If the input voltage at pin 5 is greater than the threshold voltage, an output signal is provided on line 50 to combinational logic 34 and timer/clock 52.

The output signal on line 50 to timer/clock 52 resets timer/clock 52 for a predetermined counting period. The digital timer 52 is a free-running clock running line frequency when there is no output from threshold detection circuit 48 to timer/clock 52. Timer/clock 52 resets upon receipt of a signal on line 50 from threshold detection circuit 48.

Timer control circuit 58 is used to establish a time-out period typically approximately 4 minutes. Timer control circuit 58 provides a signal on line 60 to combinational logic 34 indicative of the established time-out period. In a test mode when pin 10 is coupled to ground at pin 11 via a jumper, the time-out period is modified to approximately 4 seconds.

When the sensed ambient light is above a predetermined level, ambient light sensing circuit 36 provides a high signal to combinational logic 34. Combinational logic 34 in response to this high signal disarms and is incapable of providing a control signal on line 62 to output driver 64. As such, triac Q1 is off, i.e., non-conducting and the lamp is turned off.

When the sensed ambient light is below a certain level and the low signal is provided from ambient light sensing circuit 36. In response to this signal, combinational logic 36 is armed so it may provide a control signal on line 62 to the output driver 64. Upon detection of typically moving human body via sensor 02, high gain bandpass amplifier 42 along with its associated circuitry, threshold detection circuit 48 provides a detection signal to combinational logic 34 and timer/clock 52. The detection signal also resets timer/clock 52.

Combinational logic 34 in response to the detection signal and the low signal from ambient light sensing circuit 36, at the next zero crossing signal from line sync circuit 30 provides a control signal to output driver 64. Output driver 64 in response to the control signal generates a conduction signal that is output to the gate of triac Q1 which causes triac Q1 to conduct. Should no additional infrared signals be detected by sensor U2 before timer/clock 52 reaches a count equivalent to a count established by timer control circuit 58, combinational logic 34 will discontinue the control signal. The output driver will resultant discontinue the conduction signal and triac Q1 will turn off. In response to the turning off of triac Q1, the lamp will extinguish. However, should during the time-out period an additional body heat signal be detected, timer/clock 52 will reset and continue counting until the time-out period is met or reset.

It should be well understood that those skilled in the art that from the teachings of the present invention many variations and specific implementations of each of the elements of FIG. 6 may be realized.

The previous description of the preferred embodiments are provided to enable any person skilled in the art to make or use the present invention. Various modification to these embodiments will be readily apparent to those skilled in the art, and the generic principles defined herein may be applied to other embodiments without the use of the inventive faculty. Thus, the present invention is not intended to be limited to the embodiments shown herein, but is to be accorded the widest scope consistent with the principles and novel features disclosed herein.

What is claimed is:

1. A signal processor comprising:
   a first capacitor having a first plate connected to an input terminal and having a second plate;
   a first CMOS operational amplifier having an inverting input terminal connected to said second plate of said first capacitor and electrically isolated from a ground potential, having a noninverting input terminal connected to a reference potential unequal to said ground potential, and having an output terminal:
   a first resistor having a first terminal connected to said inverting input terminal of said first CMOS operational amplifier and having a second terminal connected to said output terminal of said first CMOS operational amplifier;
   a second capacitor having a first plate connected to said inverting input terminal of said first CMOS operational amplifier and having a second plate connected to said output terminal of said first CMOS operational amplifier;
   a second resistor having a first terminal connected to said output terminal of said first CMOS operational amplified and having a second terminal;
   a second CMOS operational amplifier having an inverting input terminal connected to said second terminal of said second resistor and electrically isolated from said ground potential, having a noninverting input terminal connected to said reference potential, and having an output terminal;

a third resistor having a first terminal connected to said inverting input terminal of said second CMOS operational amplifier and having a second terminal connected to said output terminal of said second CMOS operational amplifier;

a third capacitor having a first plate connected to said inverting input terminal of said second CMOS operational amplifier and having a second plate connected to said output terminal of said second CMOS operational amplifier; and a fourth capacitor having a first plate connected to said output terminal of said second CMOS operational amplifier and having a second plate.

2. A signal processor as in claim 1 wherein said reference potential is a predetermined positive potential.

3. A signal processor as in claim 1 wherein said first capacitor has approximately fifty times the capacitance of said second capacitor.

4. An infrared detection device comprising:

an infrared radiation sensor having a first terminal connected to a reference potential and having a second terminal;

a first capacitor having a first plate connected to said sensor second terminal and having a second plate;

a first CMOS operational amplifier having an inverting input terminal connected to said second plate of said first capacitor and electrically isolated from a ground potential, having a noninverting input terminal connected to a first reference potential unequal to a ground potential, and having an output terminal;

a first resistor having a first terminal connected to said inverting input terminal of said first CMOS operational amplifier and having a second terminal connected to said output terminal of said first CMOS operational amplifier;

a second capacitor having a first plate connected to said inverting input terminal of said first CMOS operational amplifier and having a second plate connected to said output terminal of said first CMOS operational amplifier; a second resistor having a first terminal connected to said output terminal of said first CMOS operational amplifier and having a second terminal;

a second CMOS operational amplifier having an inverting input terminal connected to said second terminal of said second resistor and electrically isolated from said ground potential, having a noninverting input terminal connected to said first reference potential and having an output terminal;

a third resistor having a first terminal connected to said inverting input terminal of said second CMOS operational amplifier and having a second terminal connected to said output terminal of said second CMOS operational amplifier;

a third capacitor having a first plate connected to said inverting input terminal of said second CMOS operational amplifier and having a second plate connected to said output terminal of said second CMOS operational amplifier;

a fourth capacitor having a first plate connected to said output terminal of said second CMOS operational amplifier and having a second plate; and comparator means connected to said second plate of said fourth capacitor for comparing the signal provided on said second plate of said fourth capacitor to a predetermined reference potential.

5. A high gain bandpass amplifier for receiving a reference voltage and for receiving and amplifying an input signal, comprising:

a dc signal isolating input capacitor having a pair of terminal, one of said terminals for receiving said input signal;

a first CMOS operational amplifier having inverting and noninverting inputs and an output, said input capacitor other terminal connected to said first amplifier inverting input with said first amplifier inverting input electrically isolated from said ground potential;

a first feedback network coupled between said first amplifier inverting input and output;

a first resistor having a pair of terminals, one of said first resistor terminal connected to said first amplifier output;

a second CMOS operational amplifier having inverting and noninverting inputs and an output, said first resistor other terminal connected to said second amplifier inverting input with said second amplifier inverting input electrically isolated from said ground potential, and said second amplifier noninverting input connected to said first amplifier noninverting input with said first and second amplifier noninverting inputs for receiving said reference voltage, said reference voltage being unequal to said ground potential;

a second feedback network coupled between said second amplifier inverting input and output; and a dc signal isolating output capacitor having a pair of terminals, one of said terminals connected to said second amplifier output.

6. The amplifier of claim 5 wherein said first feedback network comprises:

a first feedback resistor having a pair of terminals;

a first feedback capacitor having a pair of terminals wherein one terminal of said first feedback resistor and one terminal of said first feedback capacitor are connected to said first amplifier inverting input, and the other terminal of said first feedback resistor and the other terminal of said first feedback capacitor are connected to said first amplifier output.

7. The amplifier of claim 7 wherein said second feedback means comprises:

a second feedback resistor having a pair of terminals;

a second feedback capacitor having a pair of terminals wherein one terminal of said second feedback resistor and one terminal of said second feedback capacitor connected to said second amplifier inverting input, and the other terminal of said second feedback resistor and the other terminal of said second feedback capacitor connected to said second amplifier output.

8. The amplifier of claim 6 wherein said first feedback network comprises:

a first feedback resistor having a pair of terminals;

a first feedback capacitor having a pair of terminals wherein one terminal of said first feedback resistor and one terminal of said first feedback capacitor are connected to said first amplifier inverting input, and the other terminal of said first feedback resistor and the other terminal of said first feedback capacitor are connected to said first amplifier output.

9. The amplifier of claim 8 wherein said second feedback means comprises:

a second feedback resistor having a pair of terminals;
a second feedback capacitor having a pair of terminals wherein one terminal of said second feedback resistor and one terminal of said second feedback capacitor connected to said second amplifier inverting input, and the other terminal of said second feedback resistor and the other terminal of said second feedback capacitor connected to said second amplifier output.

10. The amplifier of claim 5 wherein said second feedback means comprises:
a first feedback resistor having a pair of terminals;
a first feedback capacitor having a pair of terminals wherein one terminal of said first feedback resistor and one terminal of said first feedback capacitor connected to said second amplifier inverting input, and the other terminal of said first feedback resistor and the other terminal of said first feedback capacitor connected to said second amplifier output.

11. An infrared detector system comprising:
an infrared detector having a detector output;
an input capacitor having a pair of terminals, one of said input capacitor terminals coupled to said detector output;
a first CMOS operational amplifier having inverting and noninverting inputs and an output, said input capacitor other terminal connected to said first amplifier inverting input with said first amplifier inverting input being electrically isolated from a ground potential;
a first feedback network coupled between said first amplifier inverting input and output;
a first resistor having a pair of terminals, one of said first resistor terminals connected to said first amplifier output;
a second CMOS operational amplifier having inverting and noninverting inputs and an output, said first resistor other terminal connected to said second amplifier inverting input with said second amplifier inverting input being electrically isolated from said ground potential, and said second amplifier noninverting input connected to said first amplifier noninverting input with said first and second amplifier noninverting inputs for receiving a reference voltage unequal to said ground potential;
a second feedback network coupled between said second amplifier inverting input and output; and
an output capacitor having a pair of terminals, one of said output capacitor terminals connected to said second amplifier output.

12. The system of claim 1 further comprising comparator means connected to said output capacitor other terminal for comparing a signal received from said output capacitor with a predetermined threshold and providing a detection signal when said signal exceeds said threshold.

13. The amplifier of claim 12 wherein said first feedback network comprises:
a first feedback resistor having a pair of terminals;
a first feedback capacitor having a pair of terminals wherein one terminal of said first feedback resistor and one terminal of said first feedback capacitor are connected to said first amplifier inverting input, and the other terminal of said first feedback resistor and the other terminal of said first feedback capacitor are connected to said first amplifier output.

14. The amplifier of claim 13 wherein said second feedback means comprises:
a second feedback resistor having a pair of terminals;
a second feedback capacitor having a pair of terminals wherein one terminal of said second feedback resistor and one terminal of said second feedback capacitor connected to said second amplifier inverting input, and the other terminal of said second feedback resistor and the other terminal of said second feedback capacitor connected to said second amplifier output.

* * * * *